United States Patent
Boettcher et al.

(10) Patent No.: US 8,108,740 B2
(45) Date of Patent: Jan. 31, 2012

(54) METHOD FOR OPERATING A MEMORY DEVICE

(75) Inventors: Joern Boettcher, Abstatt (DE); Jens Liebehenschel, Liederbach (DE)

(73) Assignee: Robert Bosch GmbH, Stuttgart (DE)

( * ) Notice: Subject to any disclaimer, the term of this patent is extended or adjusted under 35 U.S.C. 154(b) by 445 days.

(21) Appl. No.: 12/225,502

(22) PCT Filed: Mar. 14, 2007

(86) PCT No.: PCT/EP2007/052379
§ 371 (c)(1),
(2), (4) Date: Apr. 24, 2009

(87) PCT Pub. No.: WO2007/110325
PCT Pub. Date: Oct. 4, 2007

(65) Prior Publication Data
US 2009/0222702 A1 Sep. 3, 2009

(30) Foreign Application Priority Data
Mar. 24, 2006 (DE) .......................... 10 2006 013 758

(51) Int. Cl.
*G11C 29/00* (2006.01)
*G06F 11/00* (2006.01)

(52) U.S. Cl. .......................................... 714/718; 714/39
(58) Field of Classification Search .................. 714/718, 714/39, 42, 47, 48, 54, 807, 799; 365/201, 365/185.33, 230.03, 200
See application file for complete search history.

(56) References Cited

U.S. PATENT DOCUMENTS

| | | | | | |
|---|---|---|---|---|---|
| 4,833,665 | A | * | 5/1989 | Tokumitsu et al. | ........ 369/53.17 |
| 5,475,693 | A | | 12/1995 | Christopherson | |
| 5,860,124 | A | * | 1/1999 | Matthews et al. | ............. 711/165 |
| 6,058,047 | A | | 5/2000 | Kikuchi | |
| 6,249,465 | B1 | * | 6/2001 | Weiss et al. | .................... 365/200 |
| 6,701,464 | B2 | * | 3/2004 | Austen et al. | .................... 714/48 |
| 6,751,123 | B2 | | 6/2004 | Katayama et al. | |
| 7,093,190 | B1 | * | 8/2006 | Kuslak et al. | ................. 714/805 |
| 7,757,153 | B2 | * | 7/2010 | Hwang et al. | ................. 714/763 |
| 7,881,133 | B2 | * | 2/2011 | Hwang et al. | ................. 365/200 |

\* cited by examiner

*Primary Examiner* — Phung M Chung
(74) *Attorney, Agent, or Firm* — Kenyon & Kenyon LLP

(57) ABSTRACT

In the method for operating a memory device which has a number of memory blocks, the memory blocks are marked as intact, suspect, or defective. The memory blocks marked as suspect are monitored. If the number of memory blocks marked as intact in the memory device falls below a predetermined limit, at least one of the memory blocks marked as suspect is subsequently marked as intact and is used.

8 Claims, 2 Drawing Sheets

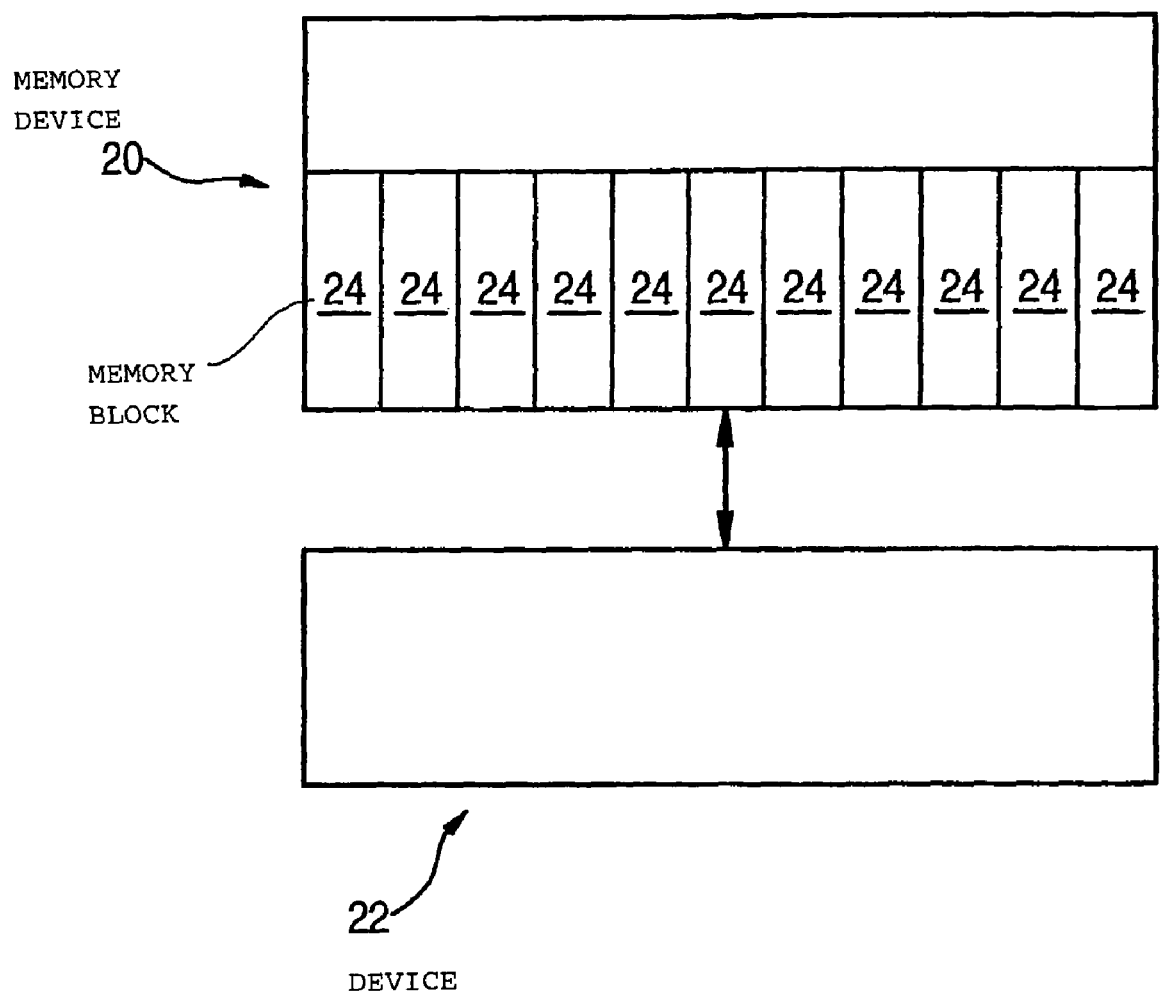

METHOD FOR OPERATING A MEMORY DEVICE

FIELD OF THE INVENTION

The present invention relates to a method for operating a memory device, a device for operating a memory device, a memory device, a computer program, and a computer program product.

BACKGROUND INFORMATION

When storing non-volatile data on media such as an EEPROM (memory hardware) or in certain classes of block-oriented EEPROM file systems, there is no fixed assignment of data to memory areas on the medium. The data are always stored at different positions. It is therefore necessary to search for empty blocks before writing data. When searching for free blocks, no defective blocks should be selected; furthermore, a maximum possible number of free blocks should always be available.

Due to defects in such memory hardware or due to unfinished write operations, power failures, or resets, blocks may appear defective from the software's point of view. In general, it is impossible to tell by reading the data and the management information whether a block is actually defective or only appears defective.

A reason for an erroneous memory content is therefore impossible to recognize with absolute certainty. However, when a memory fault is detected, often either the corresponding block is marked as defective and is not used again or the fault is ignored and the block continues to be normally used. Both of these procedures result in problems regarding data availability.

If blocks that appear defective are marked defective and are not used again, they are reliably not used any further, but blocks appearing defective, for example, due to unfinished write operations, are also not used again. As a result, possibly more and more blocks marked defective, but which are actually intact, may be present in the system. Consequently, the other blocks are more intensively used for write accesses, or an insufficient number of blocks is available, so that the system is no longer able to store data. One result is that the system is recognized as defective, although it is not.

If a fault is ignored and the block continues to be normally used, there is no danger of intact blocks being recognized as defective and not being used again. There is, however, the risk that blocks having permanent hardware faults are used again and again and thus data continue to be lost.

SUMMARY OF THE INVENTION

In the method according to the present invention for operating a memory device which has a number of blocks, blocks are marked, and blocks marked as suspect are monitored.

The present invention also relates to a device for operating a memory device, this memory device having a number of blocks, and the device being designed for marking blocks of the memory device and for monitoring blocks marked as suspect.

The present invention furthermore relates to a memory device which has a number of blocks and is designed for marking blocks and for monitoring blocks marked as suspect.

All steps of the method according to the present invention are executable by using the device according to the present invention and the memory device according to the present invention. There may be an interaction between the device according to the present invention and the memory device according to the present invention. In possible specific embodiments of the present invention, the device may be designed as a component of the memory device or the memory device may be designed as a component of the device.

The computer program according to the present invention having program code means is provided for executing all steps of the method according to the present invention when the computer program is executed on a computer or a corresponding computing unit, in particular on a device according to the present invention.

The computer program product according to the present invention having program code means which are stored on a computer-readable data medium is provided for executing all steps of the method according to the present invention when the computer program is executed on a computer or a corresponding computing unit, in particular on a device according to the present invention.

An availability of a service for storing non-volatile data on certain block-oriented EEPROM devices or file systems may be enhanced using the method or a suitable strategy.

The particular block is recognized and classified not only as intact, in which case it may be either free or occupied, or defective and marked accordingly, but, since the block may also be classified as suspect, an intermediary status of the particular block between intact and defective may also be characterized. Blocks assigned to this novel intermediary status may be monitored in further development on the basis of a marking thus provided.

A block may be recognized as having a defective configuration only after the occurrence of two consecutive errors, and the second error must occur in the suspect state. Using these, now three, states: intact, suspect, and defective, the probability of correct recognition of the actual status of a block may be increased. Intact blocks may be either free or occupied. In one configuration, the blocks are actively marked as intact or suspect. Active marking as defective may also occur, but a marking of this type may also occur automatically due to a defect.

One advantage of the present invention is that better availability and longer service life of the memory device are achieved. Furthermore, storage of non-volatile data may thus be improved.

In the memory devices or file systems described herein, data are stored in one block or in a plurality of blocks on the particular memory device or on an appropriate medium depending on their length. Real or suspected physical errors in the blocks are recognized via the test data also stored on the medium, for example, CRC (Cyclic Redundancy Check) in a checksum operation, or an error-recognition code.

There may be different reasons for a block or a memory cell to appear defective. Thus, permanent errors, so-called stuck-at errors, may occur in the memory hardware. In this case, a memory cell always has only one value, usually "logical 0" or "logical 1." These are permanent physical errors. This error type may be detected via proofreading after storage.

Furthermore, transient errors may occur in the hardware, which are typically caused by EMC problems or cosmic radiation. These errors are manifested in bit flipping. After the corresponding memory cell is overwritten, the error is no longer present and is not more likely to occur again in this memory cell than previously. This is a one-time physical error.

In addition, errors due to aging phenomena may occur in the hardware. With an increasing number of operations, the memory cells become fatigued, which is manifested in shorter and shorter data retention time. When this so-called data retention time becomes too short, recurring errors result, which, however, unlike permanent errors, cannot be recognized by re-reading a previously written value. Compared with transient errors, errors due to aging phenomena occur repeatedly, always on the same memory cells.

Unfinished write operations due to power failures or resets may make blocks appear to be defective, although there is no hardware error. The same situations as those due to hardware errors may arise in the memory device.

Thus, different reasons may cause identical observable symptoms in the blocks. The reason is not recognizable unambiguously from the particular symptom, in particular from a memory content of the block appearing to be erroneous. Therefore, an unambiguous conclusion, according to which the block is or is not to be further used according to known procedures, cannot be drawn therefrom.

Using the novel status "suspect" introduced within the present invention, it is possible initially not to use a block any longer marked as intact in which an error has once occurred. The risk of data loss due to permanent hardware faults is thus reduced. If the number of the still available blocks drops below a limit to be established, the suspect blocks may also be used again. This is, however, true only for blocks which have not been modified again after being marked as suspect. If they are modified again, i.e., repeatedly, they are considered defective and are not used again.

It must be noted that a free block may contain either the correct values for free blocks or erroneous values. This becomes apparent when free blocks are completely erased and filled with certain values. An occupied block may also be either correct or erroneous. This becomes apparent via test data or an error-detecting code. The operations of the memory device or file system to be performed are thus to improve the probability of a correct block status diagnosis with the aid of the additional status "suspect."

Different aspects influence the selection of strategies for handling blocks that appear defective. Thus, an error model of the memory device and thus of the hardware may be taken into account; this error model may include types of errors and probabilities of individual types of errors.

The possible states of blocks may be used as appropriate. In this respect, it is conceivable that points in time for recognizing and marking suspect blocks, as well as a strategy for resumed use of suspect blocks, be taken into account.

In another embodiment, errors may be handled in a context of managing non-volatile data within the memory device or the file system. In addition, error handling may depend on possible conditions of use of the memory device for managing non-volatile data.

The method according to the present invention, which makes it possible to handle the different block states, may be established on the basis of non-functional requirements.

For example, if there are strict requirements for a long service life of a memory device, occasional data losses are acceptable under this aspect. In this case certain guidelines may be observed via the method and by coding the data on the memory device.

If a block contains an error which most probably arose due to an interrupted operation with subsequent restart of a file system having the device and/or the memory device, this block may continue to be used normally.

If a block contains an error, which most probably arose due to a permanent physical error, this block may be marked as suspect. Blocks which have been suspect for a certain or defined time, which may be established according to the requirements, but in which no second error has occurred, may be switched back to the intact state.

The method may ensure that most probably only actually defective blocks are classified and marked as defective. The quality of a service for managing non-volatile data in the blocks of the memory device may be improved and the quality may be reliably assessed.

The present method, which may be executed in two steps, for example for handling possibly defective blocks, offers the option in a project to establish a strategy for handling possibly defective blocks, which takes into account a reasonable combination of the non-functional service life and data security requirements. This is not possible in the case of the known procedure, according to which a block is either always or never marked as defective.

By adequately using the three states intact, suspect, and defective, presented with the present invention, the probability of blocks having permanent defects being used repeatedly, as in the related art, and causing repeated data losses may be reduced. In addition, it may be avoided that blocks having transient errors are no longer used. This would result in the memory device appearing defective earlier than necessary.

The present invention may be used in an embedded system having an EEPROM file system as a device and/or memory device.

The method may be generalized from certain memory devices having file systems to problems with redundant hardware. In this case the blocks are redundant because more blocks are available than actually needed and some of these blocks may be dispensed with. It is also usable in areas other than embedded systems or corresponding computer-supported modules.

The details of the method for detecting and marking suspect blocks and their repeated use may be affected by other aspects not mentioned here.

There may be different aspects which, when taken into account, may allow blocks marked as suspect to be revived again. Such revival may take place as needed or after a certain time. Only the required number of blocks or all suspect but not defective blocks may be revived. This may depend on the non-functional requirements for the system in each case.

A free block may contain correct as well as erroneous values. By using a hardware property of certain EEPROMs, according to which an erase and write operation may be separated without affecting the service life of an EEPROM, the concept presented here may be effectively supported.

The memory device may be designed as an EEPROM (Electrically Erasable Programmable Read-Only Memory) or as a non-volatile, electronic memory module which is used in embedded systems, for example in computer technology.

EEPROMs may be used economically by effective use of available blocks with the help of the present invention. Other resources such as RAM, ROM, or run-time may be used if needed within certain limits. The service life of EEPROM memories or memory hardware may thus be extended.

BRIEF DESCRIPTION OF THE DRAWINGS

FIG. 2 schematically shows a specific embodiment of a memory device and of a device.

DETAILED DESCRIPTION

Figure 1:
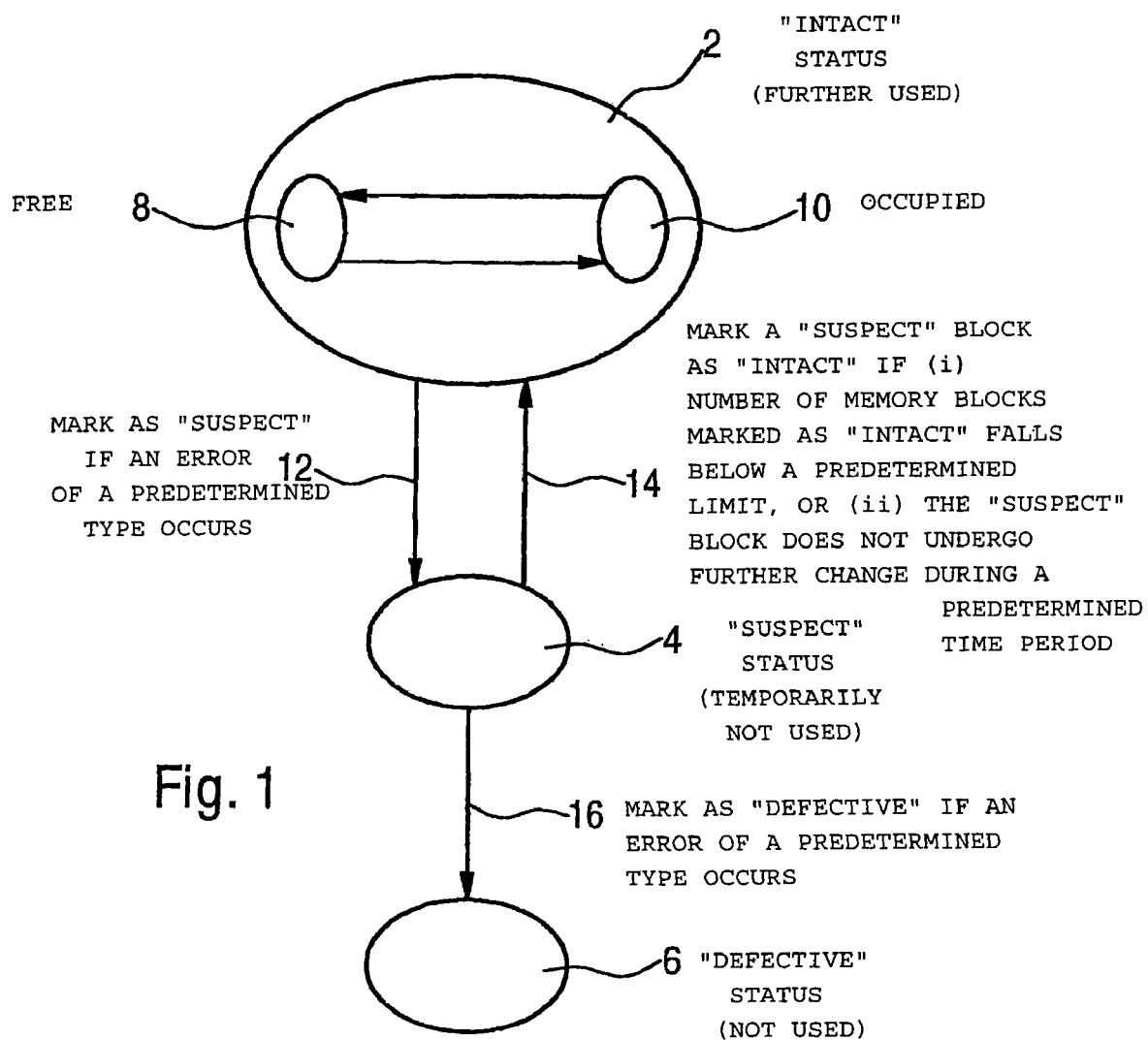
FIG. 1 shows a diagram of possible state transitions of blocks.

The diagram of FIG. 1 depicts the three possible states intact 2, suspect 4, and defective 6, using which a block in a memory device may be classified and marked.

When the memory device is operated, it is provided that the block is marked according to its instantaneous state as intact 2, suspect 4, or defective 6. A defect marking may, however, also occur due to defects in the system.

The block is marked as intact 2 if it has no errors. Such errorless blocks are used when operating the memory device; these blocks marked as intact 2 may be free 8 or occupied by data 10. Due to repeated erase and write operations, a switchover of the block between free 8 and occupied 10 is possible at any time.

If an error of a certain class occurs in the block originally marked as intact 2, it is provided that this block is marked as suspect 4 and thus assigned to an intermediary status, resulting in a first possible transition 12 between the states intact 2 and suspect 4 for the block. If the block is thus marked as suspect 4, this block is not used for the time being; furthermore, the further development of this block is monitored.

Should the status of the block marked as suspect 4 not change, which means that no further error occurs in the block, the block marked as suspect 4 is marked as intact 2 in a second possible transition 14 and reactivated out of the intermediary suspect 4 status. This may take place after an established time period or as a function of further conditions if this block is to be used again for storing data.

In the case where a further error occurs in the block marked as suspect 4, this block marked as suspect 4 goes over into the "defective" 6 status via a third possible transition 16. This means that this block is definitively not used any further.

FIG. 2 schematically shows a specific embodiment of a memory device 20 and a device 22 which interact with each other. Memory device 20 has a number of blocks 24, in which data may be stored. Such data may, however, be erased again. In carrying out the method described in FIG. 1, each block 24 is marked as intact, suspect, or defective and is used and handled according to the particular marking.

Such a classification of blocks 24 of memory device 20 and their marking as a function thereof may be carried out by memory device 20 and/or device 22.

What is claimed is:

1. A method for operating, by a control device, a computer-readable memory device which has a plurality of memory blocks, comprising:
marking, by the control device, each of the memory blocks according to a status of each memory block, wherein: (i) each memory block temporarily classified as faulty is marked as suspect and is temporarily not used; (ii) each memory block classified as faultless is marked as intact and is further used; and (iii) each memory block permanently classified as faulty is marked as defective and is not used; and
monitoring, by the control device, the memory blocks marked as suspect, wherein if the number of memory blocks marked as intact in the memory device falls below a predetermined limit, at least one of the memory blocks marked as suspect is subsequently marked as intact and is used.

2. The method according to claim 1, wherein a frequency of errors occurring in the memory block is taken into account in the marking of the memory block.

3. The method according to claim 1, wherein a memory block marked as intact is marked as suspect after an occurrence of an error of a predetermined type.

4. The method according to claim 1, wherein a memory block marked as suspect is marked as defective after an occurrence of an error of a predetermined type.

5. The method according to claim 1, wherein in the case where a memory block marked as suspect does not undergo further changes during a predetermined time period, the memory block marked as suspect is subsequently marked as intact and is reused.

6. A control device for operating a computer-readable memory device, the memory device having a number of blocks, the control device comprising:
an arrangement configured to:
mark each of the memory blocks according to a status of each memory block, wherein: (i) each memory block temporarily classified as faulty is marked as suspect and is temporarily not used; (ii) each memory block classified as faultless is marked as intact and is further used; and (iii) each memory block permanently classified as faulty is marked as defective and is not used; and
monitor the memory blocks marked as suspect, wherein if the number of memory blocks marked as intact in the memory device falls below a predetermined limit, at least one of the memory blocks marked as suspect is subsequently marked as intact and is used.

7. A computer-readable memory device comprising:
a plurality of memory blocks; and
an arrangement configured to:
mark each of the memory blocks according to a status of each memory block, wherein: (i) each memory block temporarily classified as faulty is marked as suspect and is temporarily not used; (ii) each memory block classified as faultless is marked as intact and is further used; and (iii) each memory block permanently classified as faulty is marked as defective and is not used; and
monitor the memory blocks marked as suspect, wherein if the number of memory blocks marked as intact in the memory device falls below a predetermined limit, at least one of the memory blocks marked as suspect is subsequently marked as intact and is used.

8. A non-transitory computer-readable data storage medium containing a computer program having program codes which, when executed by a processor, performs a method for operating a computer-readable memory device which has a plurality of memory blocks, the method comprising:
marking each of the memory blocks according to a status of each memory block, wherein: (i) each memory block temporarily classified as faulty is marked as suspect and is temporarily not used; (ii) each memory block classified as faultless is marked as intact and is further used; and (iii) each memory block permanently classified as faulty is marked as defective and is not used; and
monitoring the memory blocks marked as suspect, wherein if the number of memory blocks marked as intact in the memory device falls below a predetermined limit, at least one of the memory blocks marked as suspect is subsequently marked as intact and is used.

* * * * *